United States Patent
Chang et al.

(10) Patent No.: US 6,219,290 B1
(45) Date of Patent: Apr. 17, 2001

(54) MEMORY CELL SENSE AMPLIFIER

(75) Inventors: Kuen-Long Chang, Taipei; Chun-Hsiung Hung, Hsinchu; Ken-Hui Chen, TaiChung; I-Long Lee, Hsinchu; Yin-Shang Liu, Tsao-Twen, all of (TW); Ray-Lin Wan, Fremont, CA (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/172,274

(22) Filed: Oct. 14, 1998

(51) Int. Cl.$^7$ .................................................. G11C 7/02
(52) U.S. Cl. ...................... 365/207; 365/185.21
(58) Field of Search ................ 365/207, 189.07, 365/233.5, 185.21

(56) References Cited

U.S. PATENT DOCUMENTS

| | | | |
|---|---|---|---|
| 5,241,505 | * 8/1993 | Hashimoto | 365/210 |
| 5,508,958 | 4/1996 | Fazio et al. | 365/185.19 |
| 5,526,307 | 6/1996 | Yiu et al. | 365/185.01 |
| 5,528,544 | * 6/1996 | Kohno | 365/207 |
| 5,530,671 | * 6/1996 | Hashimoto | 365/189.07 |
| 5,602,775 | 2/1997 | Vo | 365/185.01 |
| 5,602,777 | 2/1997 | Nawaki et al. | 365/185.09 |
| 5,694,370 | * 12/1997 | Yoon | 365/233.5 |
| 5,699,295 | 12/1997 | Yero | 365/185.21 |
| 5,701,269 | 12/1997 | Fujii | 365/210 |
| 5,751,631 | 5/1998 | Liu et al. | 365/185.01 |

* cited by examiner

Primary Examiner—Richard Elms
Assistant Examiner—VanThu Nguyen
(74) Attorney, Agent, or Firm—Mark A. Haynes; Haynes & Beffel LLP

(57) ABSTRACT

A sensing circuit for sensing the logic state of a memory cell which minimizes read times is described which includes a first circuit branch corresponding to an array circuit path and a second circuit branch corresponding to a reference cell circuit path. In operation during the pre-decode interval, additional load and current generation circuitry are enabled in the first circuit path so that the voltage as seen by the sensing input of a sensing circuit comparator is driven to be essentially equivalent to that of the reference signal as established by the reference cell circuit path on the reference input of the sensing circuit comparator. Once the address has been decoded, the additional load circuitry is disabled so as to allow the sensing input of the comparator to transition to a voltage representative of the logic state stored in the memory cell.

32 Claims, 8 Drawing Sheets sensing "1" from "0":

MEMORY CELL SENSE AMPLIFIER

BACKGROUND OF THE INVENTION

1. Field of the Invention

The present invention relates to memory arrays, and in particular, the sensing of data from a non-volatile memory cell.

2. State of The Art

Erasable programmable read only memories (EPROM) or electrically erasable programmable read only memories (EEPROM) use a floating gate memory cell structure for storing data. The floating gate memory cell is programmed by altering the threshold voltage of a floating gate device in the memory cell. In general, memory cells are arranged in an array such that each cell has an associated bit-line and word-line. When accessed by an input address signal applied to the memory device, a memory cell having an altered/increased threshold voltage remains turned off resulting in a first voltage level being sensed from the memory cell. A memory cell having a non-altered threshold is turned on when accessed such that a second voltage level is sensed from the memory cell.

A common bit-line to a group of memory cells is coupled to a sense amplifier which functions to compare the voltage sensed from a memory cell to the voltage of a reference signal line and output a voltage representing the logic state stored in the memory cell. FIG. 1 shows a simple circuit illustrating the manner in which a sense amplifier senses data from a floating gate memory cell structure. The current source $I_{REF}$ represents a reference cell current established in a reference circuit branch and the current source $I_{CELL}$ represents the addressed array cell current established in the array circuit branch. The voltage on the first input of the sense amplifier, $V_{SA1}$, representing the logic state of the memory cell is $V_{DD}-I_{CELL} \cdot R_1$ and the voltage on the second input of the sense amplifier, $V_{SA2}$, corresponding to the reference voltage signal is $V_{DD}-I_{REF} \cdot R_2$. If the addressed cell has been programmed such that its threshold voltage Vt is increased to a high level the $I_{CELL}$ will be very small and consequently, $V_{SA1}>V_{SA2}$. On the other hand, if the addressed cell has not been programmed such that its threshold voltage is low and if $I_{CELL}$ is large enough, then $V_{SA1}<V_{SA2}$.

FIG. 2 shows a prior art sense amplifier structure which includes load devices M0 and M2–M4 which correspond to resistors $R_1$ and $R_2$, respectively, a pre-charging circuit situated in the array circuit branch path including device M1 and inverter XI1, a cell pre-charging circuit situated in the reference cell circuit branch path including device M5 and inverter X12, column-select or bit line transistors MBL0–MBL2, a reference cell XREF0, floating gate devices XCELL0–XCELL2 connected to different respective word lines WL0–WL2, and a comparator U1. FIG. 2 does not show in detail the array structure. A detailed description of an example of an array architecture is disclosed in U.S. Pat. No. 5,526,307 assigned to the assignee of the present application.

The floating gate memory cells are programmed by adjusting the threshold voltages of the memory cell devices XCELL0–XCELL2. The reference cell XREF0 has its control gate and floating gate tied together. Its threshold voltage is predetermined by the fabricating process such that when a signal RWL is applied the reference cell turns on and a predetermined current $I_{REF}$ is pulled through the reference cell circuit branch path.

In operation, if the input address to the device is decoded and the WL0 and BL0 signal lines are selected, the addressed column selector MBL0 is turned on pulling the bit-line 20 coresponding to cell XCELL0 LOW. With bit-line 20 LOW, the memory cell pre-charging circuit begins to pre-charge bit-line 20 and establishes a voltage (such as 1.2V) at the drain side of the addressed cell, (XCELL0 in this case). The reference cell sensing path mirrors the operation of the memory cell sensing path. For instance, when the RWL signal is applied, the reference cell XREF0 is turned on and the reference cell pre-charging circuitry also begins to pre-charge the reference signal line to establish a pre-charge voltage at the drain of the reference cell XREF0. The RWL signal may either be pulsed or constant. The voltage $V_{SA1}$ on the first input of the comparator U1 coupled to the memory cell sensing path is $V_{SA1}=VDD-I_{XCELL0} \cdot R_{M0}$, and the voltage $V_{SA2}$ voltage on the second input of the comparator U1 coupled to the reference cell sensing path is $V_{SA2}=VDD-I_{XREF0} \cdot R_{M2\|M3\|M4}$.

In order to ensure proper operation it is necessary to design the circuit such that when a memory cell is programmed to have a high threshold voltage (i.e. logic "1"), only a small amount of leakage current flows through the memory cell sensing path such that $V_{SA1}>V_{SA2}$. On the other hand, when the memory cell is not programmed and has a low threshold voltage (i.e. logic "0"), the circuit design must ensure that enough current flows through the memory cell sensing path such that $V_{SA1}<V_{SA2}$. In particular, if "1" is sensed (SAOUT="1"), then $V_{SA1}>V_{SA2}$ or $VDD-I_{XCELL0} \cdot R_{M0}>VDD-I_{XREF0} \cdot R_{M2\|M3\|M4}$ which reduces to $R_{M0}/R_{M2\|M3\|M4}<I_{XREF0}/I_{XCELL0}$. The ratio of $R_{M0}/R_{M2\|M3\|M4}$ is referred to as the sensing ratio. Hence, in order to ensure sensing accuracy the sensing ratio needs to be preserved.

The sequence of sensing the memory cell shown in FIG. 2 is as follows and is shown in FIGS. 3A and 4A. In general, a chip enable signal is initially applied to the memory device at time T1. Alternatively, an ADDRESS transient signal may also be used to initiate the read operation wherein when an address is applied, an ADDRESS transient signal is generated. At the same time, or shortly thereafter, an address is applied to the input of an address decoder (not shown) of the memory device thereby initiating the decoding of the address. An interval of time ΔT occurs in which the address is decoded. Once decoded a select signal is provided to the gate of one of the bit-line select transistors BL0–BLn and to one of the word-line select signal lines WL0–WLn. The address is decoded at time T2 and depending on whether the addressed memory cell is programmed with a high threshold voltage or a low threshold voltage, $V_{SA1}$ begins to fall (FIG. 3A) or rise (FIG. 4A). Finally, $V_{SA1}$ and $V_{SA2}$ are compared by comparator U1 and the compared result is sent to an output buffer (not shown).

From the above description, the voltage on the sense amplifier input SA1 only begins to rise or fall after address decoding is complete. Referring to FIG. 3A, assume "0" is to be sensed in the case in which the previous state of the memory cell was a "1" logic state. In general, the amount of time to decode the address ΔT may be in the range of 15 nsec or more. Therefore, if the 15 ns latency can be reduced or eliminated, the read speed can be improved. A similar impact also occurs in sensing a "1" logic state in the case in which the previous state of the memory cell was a "0" logic state as shown in FIG. 4A.

One prior art technique used to overcome the above problem is to equalize both sides of the differential sense amplifier. For instance U.S. Pat. No. 4,884,214 entitled "Nonvolatile Semiconductor Memory Device" uses an equalization circuit which is responsive to an address transition detection (ATD) signal to precharge both inputs of the differential sense amplifier to a high potential level during a non-read out period.

Similarly, in U.S. Pat. No. 5,524,094 entitled "Nonvolatile Memory Device with NAND Array" an equalizing circuit is used to equalize both inputs of the sense amplifier to an intermediate voltage of ½ VCC.

Finally, U.S. Pat. No. 5,559,737 entitled "Nonvolatile Semiconductor Memory Capable of Simultaneously Equalizing Bit Lines and Sense Lines" also equalizes both inputs of the sense amplifier using a bit-line biasing circuit and a dummy cell bit line biasing circuit.

In all three of these prior art techniques, an equalizing circuit/pulse is used to short both side of the sense amplifier in order to equalize the bit-line and dummy bitline inputs of the sense amplifier. In particular, a pass gate is used to isolate the equalized inputs of the sense amplifier from the bit-line and dummy bit-line and hence the pass gates require pulsing to allow for sensing of the logic state in the memory cell once the sense amplifier inputs have been equalized.

The present invention is a sense amplifier circuit which functions to reduce memory cell read times of memory cells by minimizing the impact of the address decode period on the read operation which occurs in the prior art sense amplifier circuits.

SUMMARY OF THE INVENTION

A sensing circuit is described which reduces read times of a memory cell by performing a pre-decode pre-charge step. The sensing circuit includes a comparator for comparing a voltage corresponding to the data stored in the memory cell to a reference signal line. The output of the comparator is a voltage representing the stored logic state of the memory cell. In a pre-decode time interval and in response to a detection pulse associated with a chip enable signal and/or at least one of the address inputs, the sensing circuit pre-charges the comparator sensing input to a voltage level equivalent to the comparator reference signal input. As a result, a first part of the voltage transition on the bit-line resulting from the read operation is performed during the pre-decode interval and a second part of the transition is performed after address decode, thereby accelerating the read operation.

In one embodiment the sensing circuit includes an array circuit branch including a first set of loading devices, an array branch pre-charge circuit, and an array branch dummy cell. In one embodiment of the array circuit branch, the dummy cell is referred to as a floating gate device similar to the reference cell, XREF0. The first set of loading devices includes first and second sub-sets of loading devices. The first sub-set of loading devices is constantly enabled while the second sub-set of loading devices is selectively enabled. The sensing circuit further includes a reference circuit branch having a second set of loading devices, a reference branch pre-charge circuit, and a reference branch cell. In response to a detection pulse, a pre-decode enable signal is provided which enables the second sub-set of loading devices so as to vary the sensing ratio. Also in response to the detection pulse, a pre-decode biasing voltage is provided which enables and biases the array dummy cell to provide a particular array branch current. During the pre-decode interval, the detection pulse is provided and the second sub-set of loading devices and the array dummy cell are enabled such that the voltage on the sensing input of the comparator is equivalent to the voltage on the reference signal input of the comparator.

In one embodiment, the effective loading and current characteristics seen at the sensing input of the comparator are equivalent to the effective loading and current characteristics seen at the reference signal input of the comparator during the pre-decode interval. In still another embodiment, the loading and current characteristics of the sensing input are adjusted such that the sensing ratio is approximately one during the pre-decode interval.

Once the address has been decoded, the second sub-set of loading devices and the array branch dummy cell are disabled, to change the sensing ratio. In this state, the first loading device sub-set, the array branch pre-charge circuit and the memory cell itself drive the bit-line to a voltage representing the logic level stored in the memory cell.

The dummy cell can be a conventional floating gate device; or a floating gate device with its control gate and floating gate shorted together so as to function as a current source; or even an n-channel or a p-channel device which generates constant current when biased.

In still another embodiment, the first sub-set of loading devices includes at least one MOS device enabled and biased as a resistive element coupled between a first working potential and the first input of the comparator in the sensing circuit. The second sub-set of loading devices includes at least one MOS device which is coupled between the first working potential and the first input of the comparator and which is enabled by the pre-decode enable signal during the pre-decode interval and disabled once the address has been decoded. The second set of loading devices includes at least one MOS device enabled and biased as a resistive element and coupled between the first working potential and the second input of the comparator.

In another embodiment, the array branch pre-charge circuit and the reference branch pre-charge circuit are electrically equivalent circuits and the array branch dummy cell and the reference branch cell are electrically equivalent floating gate devices. In one embodiment, the dummy cell and the reference cell have the same threshold voltages and are biased by equivalent biasing voltages during the pre-decode interval.

In still another embodiment, the sensing circuit includes an address transient detector (ATD) responsive to either the input address or a chip enable signal of the memory device. The ATD generates a detection pulse which is coupled to a voltage generator and to a load device controller. The voltage generator in response to the detection pulse generates a pre-decode biasing voltage for biasing the array branch dummy cell. The load device controller in response to the detection pulse provides the pre-decode enable signal which enables the second sub-set of loading devices during the pre-decode interval.

The sensing circuit can be used in non-volatile memory systems, including floating gate EPROM AND EEPROM systems and volatile memory systems, including a static RAM (SRAM) and a dynamic RAM (DRAM).

BRIEF DESCRIPTION OF THE DRAWINGS

The present invention may be further understood from the following written description in conjunction with the appended drawings. In the drawings.

DETAILED DESCRIPTION OF THE PREFERRED EMBODIMENTS

Figure 5:
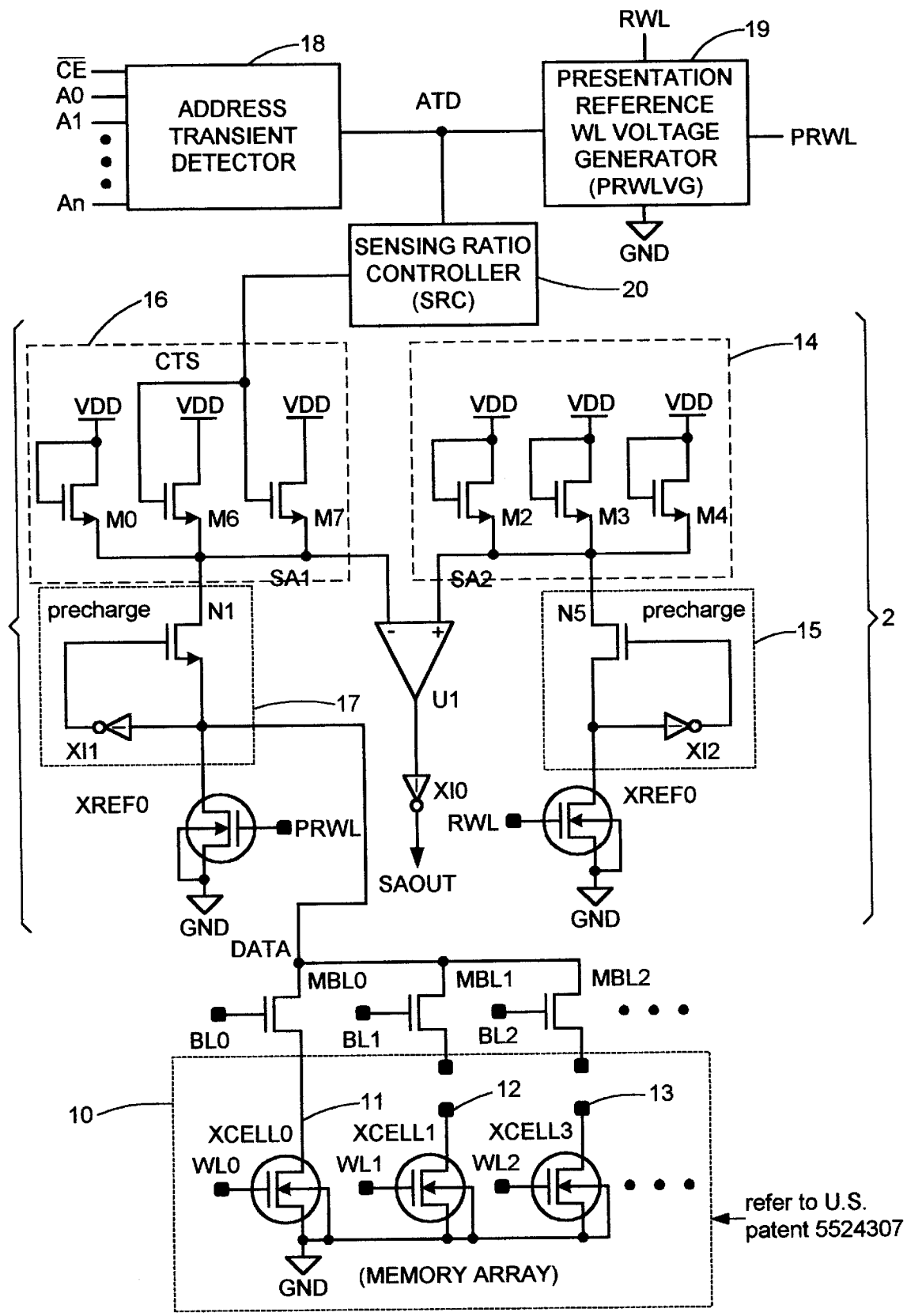
FIG. 5 is a floating gate memory cell sensing circuit including pre-decode pre-charge circuitry in accordance with one embodiment of the present invention.

An embodiment of a sensing apparatus for sensing the logic state stored in a floating gate memory cell and which accelerates memory cell read times is shown in FIG. 5. The sensing apparatus is coupled to a memory array 10 of floating gate memory cells, with each cell including a single floating gate device (e.g., XCELL0, XCELL1, XCELL2 . . . ). Each cell has an associated bit-line 11–13, respectively, which are respectively coupled to a corresponding bit-line select device (MBL0, MBL1, MBL2 . . . ). Groups of bit-line select devices are coupled to a common DATA signal line which is coupled to the sensing apparatus to allow for reading one of the memory cells which are coupled to the DATA signal line through its corresponding bit-line select device. When a memory cell's corresponding bit-line select signal (e.g., BL0, BL1, BL2, . . . ) and its word-line select signal (e.g., WL0, WL1, and WL2) are selected, one of the memory cells (XCELL0, XCELL1, XCELL2) is coupled to the DATA signal line to allow the logic state of the memory cell to be read by the sensing apparatus.

It should be understood that more than one sensing apparatus may be coupled to the array 10 where each sensing apparatus is coupled to a different group of memory cells by a common DATA line.

The sensing apparatus includes an array circuit branch 1 and a reference circuit branch 2. The reference circuit branch 2 establishes a reference voltage signal, $V_{SA2}$, on an input SA2 of a comparator U1. A current is established in the reference circuit branch 2 by biasing the reference cell XREF0 with a read word-line (RWL) signal. The reference cell is a floating gate device having a predetermined threshold voltage set during device fabrication. The reference circuit branch also includes a set of MOS devices 14 (i.e., M2, M3, and M4) which are biased as resistive loads having their gates coupled to $V_{DD}$. The set of MOS devices are coupled between $V_{DD}$ and SA2. A pre-charge circuit 15 (including MOS device M3 and inverter XI3) is coupled between the SA2 node and the reference cell device XREF0. When the bias signal RWL is applied, the pre-charge circuit 15 is enabled such that a current REF0 is established in the reference circuit branch. The reference voltage signal, VSA2, established on comparator input SA2 is dependent on the resistivity of the parallel combination of load devices M2–M4 and the reference current $I_{REF}$ as shown in equation 1 below:

$$V_{SA2}=V_{DD}-(R_{M2}\|R_{M3}\|R_{M4})\times I_{REF0} \qquad \text{Eq. 1}$$

The array circuit branch includes a set of MOS loading devices 16 (i.e., M0, M6 and M7) coupled between $V_{DD}$ and input SA1 of the comparator. The MOS loading device M0 has its gate coupled to the power supply $V_{DD}$ and hence is always biased on to provide a predetermined resistivity. Loading devices M6 and M7 have their gates coupled to pre-decode enable signal (CTS) and are biased on when CTS is driven HIGH and are disabled when CTS is LOW. A pre-charge circuit 17 (including MOS device M1 and inverter XI1) is coupled between comparator input SA1 and an array branch dummy cell, XREF1. The dummy cell is coupled between the array DATA signal line and ground (i.e., GRD) and also has a pre-determined threshold voltage set during device fabrication.

When the pre-decode bias signal PRWL is applied to the gate of cell XREF1, the pre-charge circuit 17 is enabled such that a current IXREF1 is established in the array circuit branch. The voltage $V_{SA1}$ established on comparator input SA1 is dependent on the resistivity of the load devices M0, M6, and M7 and the cell current $I_{XREF1}$ as indicated in equation 2 below:

$$V_{SA1}=VDD-(R_{M0}\|R_{M6}\|R_{M7})\times I_{XREF1} \qquad \text{Eq. 2}$$

Loading device M0 in the memory cell circuit branch and loading devices M2, M3, and M4 are selected so as to ensure a proper sensing ratio during memory cell sensing. Hence, during memory sensing, M0, M2–M4 are selected so that $R_{M0}/R_{M2\|M3\|M4}$ is greater, equal, or less than $I_{XREF0}/I_{XCELL0}$ depending on $I_{XCELL0}$.

The sensing circuit further includes an address transient detector (ATD) 18 coupled to both the Chip Enable signal (CE) and the input address (A0, A1, . . . An) of the memory device. The transient detector detects the condition when any of the input addresses or CE transition and generates a detection pulse, ATD when a transition occurs. It should be understood that the transient detector can be implemented using logic gates such that when a certain input condition is met or sensed, the transient detector outputs the ATD detection pulse. The ATD pulse is coupled to a precondition reference word-line voltage generator 19 (PRWLVG) which is also coupled to the RWL voltage signal. The RWL signal is generated by a voltage generator (not shown) and is used to bias the PRWL generator so as to generate the PRWL voltage. Alternatively, the PRWL generator is a voltage generator responsive to the ATD detection pulse and is not biased by the RWL voltage signal. Instead, in response to the ATD pulse, voltage generator 19 outputs the pre-decode bias signal, PRWL. The ATD pulse is also coupled to the sensing ratio controller 20 (SRC). Controller 20, in response to the ATD detection pulse, outputs a pre-decode enable signal, CTS, which enables and biases loading devices M6 and M7 so as to change the resistivity of the loading devices 16 in the array circuit branch.

In operation, when an address and/or chip enable signal (CE) are applied to the input of the floating gate memory device (e.g., pins), the address transient detector 18 detects that at least one of the address or chip enable signals have transitioned and the ATD detection pulse is generated. In response, voltage generator 19 is enabled and outputs voltage $V_{PRWL}$. In addition, in response to the ATD detection pulse, controller 20 outputs $V_{CTS}$=VDD. When this occurs, the dummy cell XREF1 is biased so as to establish branch current $I_{REF1}$. The reference cell XREF0 is also biased on by a constant or pulsed RWL signal so as to establish a brach current $I_{REF0}$. With CTS enabled, MOS loading devices M6 and M7 are enabled and a parallel resistivity of $R_{M0\|RM6}\|R_{M7}$ is established in array circuit branch 1. The current $I_{REF1}$ and the parallel resistivity $R_{M0}\|R_{M6}\|R_{M7}$ are selected such that during the pre-decode interval (i.e., the interval between the time when the addresses or control signals are applied to the system to the time the associated cell bit-line and word-line is decoded) the voltage $V_{SA1}$ is driven to a voltage essentially equal to $V_{SA2}$ as indicated below:

$$VDD-(R_{M2}\|R_{M3}\|R_{M4}) \times I_{REF0} \approx VDD-(R_{M0}\|R_{M6}\|R_{M7}) \times I_{REF1} \qquad \text{Eq. 3}$$

It should be noted that the pre-decoded interval can also include time in addition to the time to decode the address. Specifically, in low power applications, the power supply may be as low as 2.0 volts, while the turn-on voltage of the low-threshold cells may be as high as 2.8 volts. Consequently, even through the cell is decoded (i.e., wordline=VCC level), the wordline needs to be boosted (or pumped) to a higher 3.2 volt level, (for example) to make sure the cell device is on and current is flowing through the DATA line for sensing.

Once the address decode is complete (or once the gate of the selected cell is at a pre-determined level of VDD or higher, in the case of low power applications), both the PRWL and CTS signals are disabled (i.e., driven to a LOW state) so as to turn M6, M7 and $X_{REF1}$ off. In order to ensure that the sensed current is from the floating gate memory cell and not both the dummy cell and the memory cell in the array circuit branch, the PRWL signal is disabled prior to the CTS signal.

Once CTS is disabled, the only loading device enabled in the array circuit branch 1 is loading device M0. As a result, the sensing ratio of $R_{M0}/R_{M2\|M3\|M4}$ is preserved while the memory cell is being read so as to ensure proper sensing of data from the memory cell.

Figure 1:
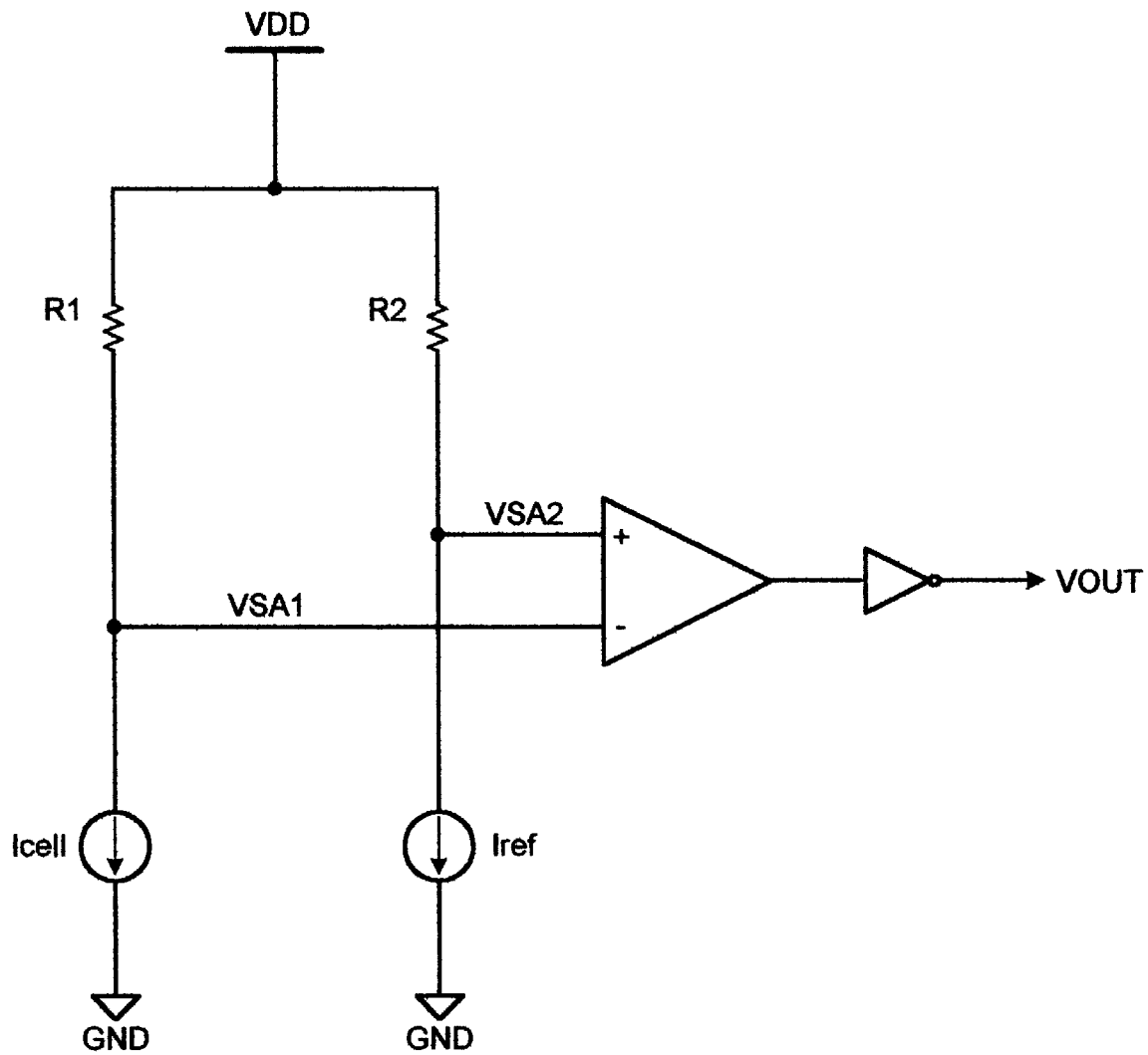
FIG. 1 shows the basic theory behind the manner in which a sense amplifier senses data from a floating gate memory cell structure.
Figure 2:
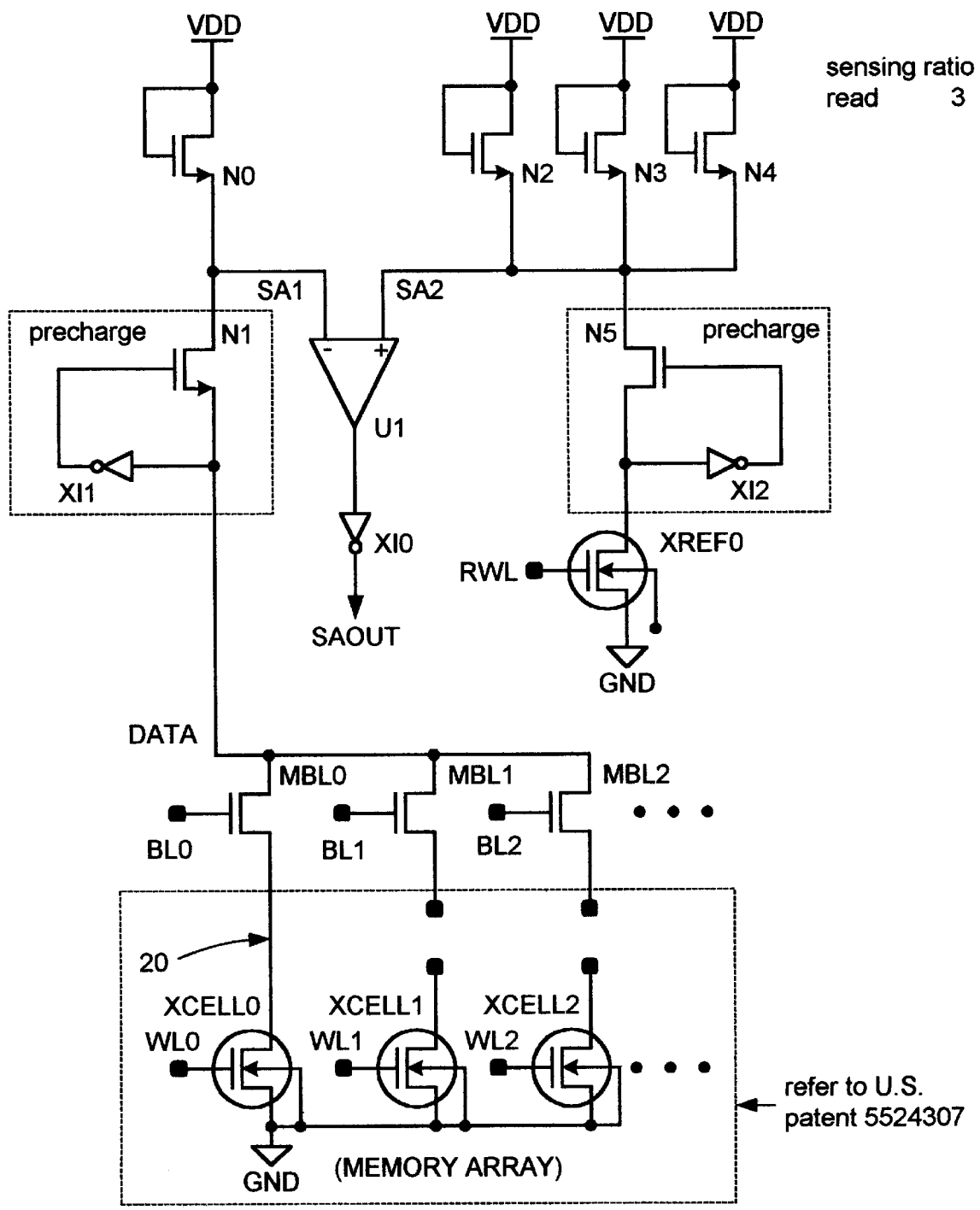
FIG. 2 shows a prior art sense amplifier structure.
Figure 3A:
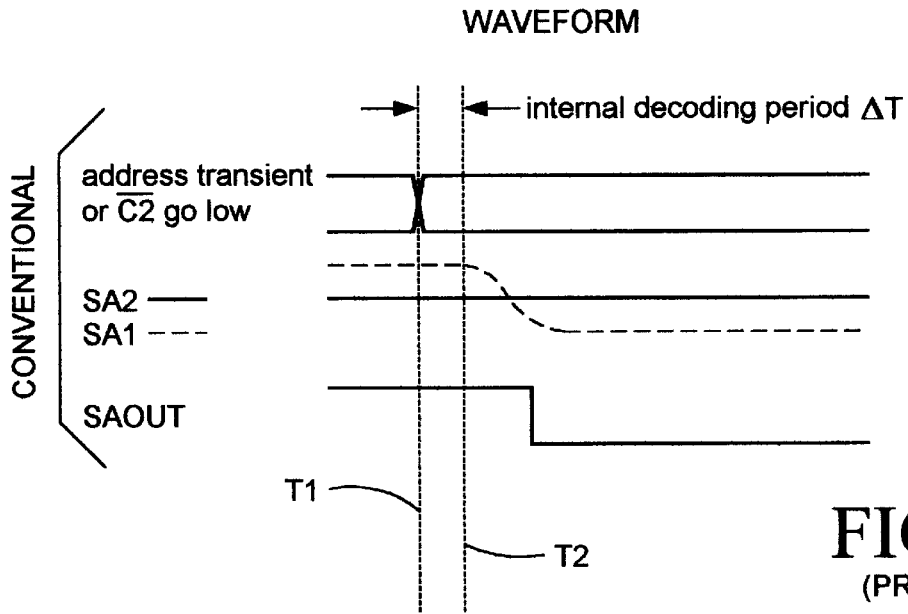
FIG. 3A is a timing diagram showing the timing sequence for sensing a high-to-low logic state transition with the sensing apparatus shown in FIG. 2.
Figure 3B:
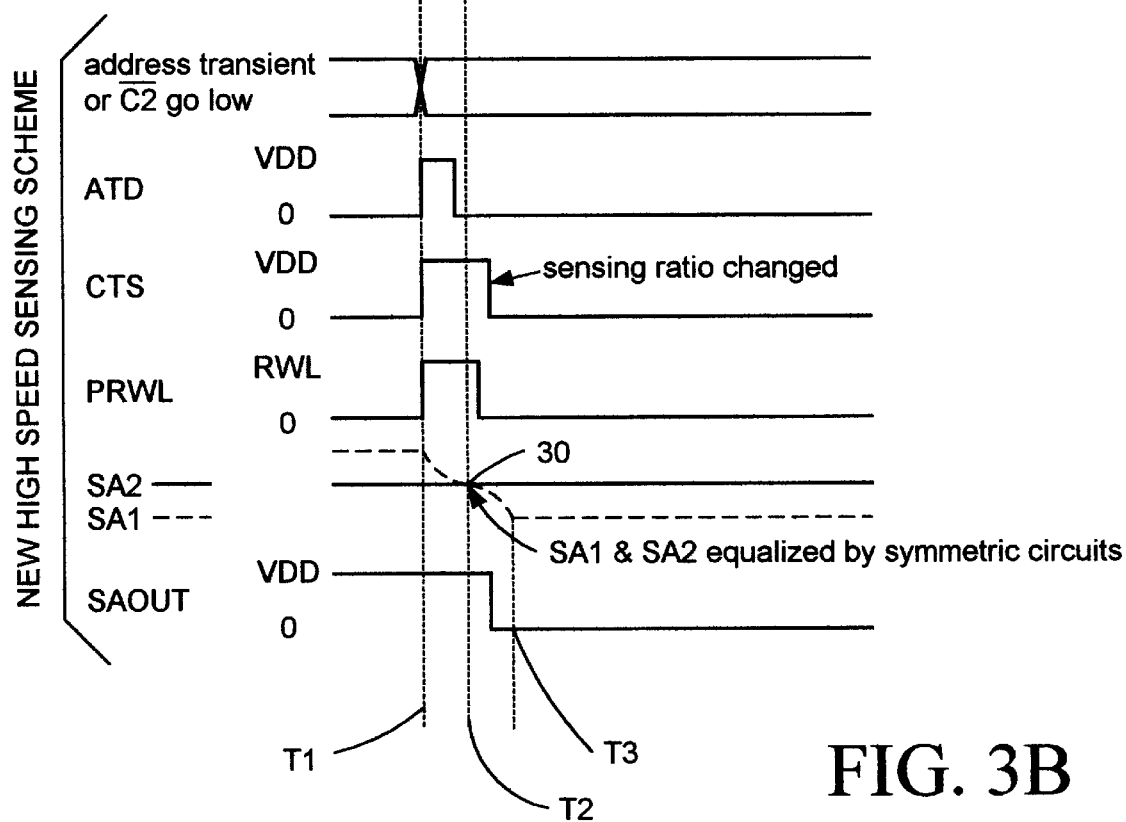
FIG. 3B is a timing diagram showing the timing sequence for sensing a high-to-low logic state transition with the sensing apparatus of the present invention shown in FIG. 5.
Figure 4A:
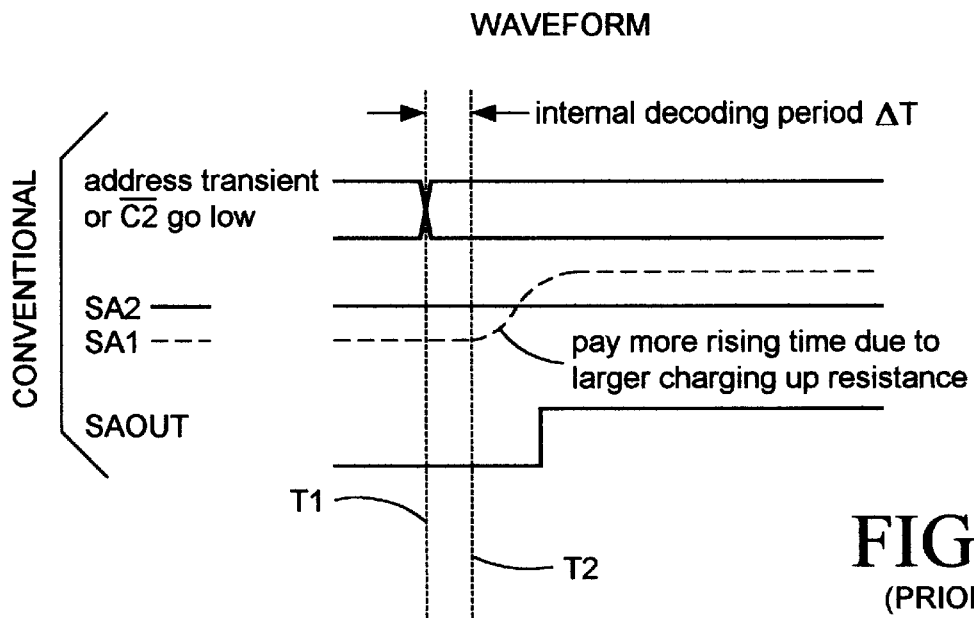
FIG. 4A is a timing diagram showing the timing sequence for sensing a low-to-high logic state transition with the sensing apparatus shown in FIG. 2.
Figure 4B:
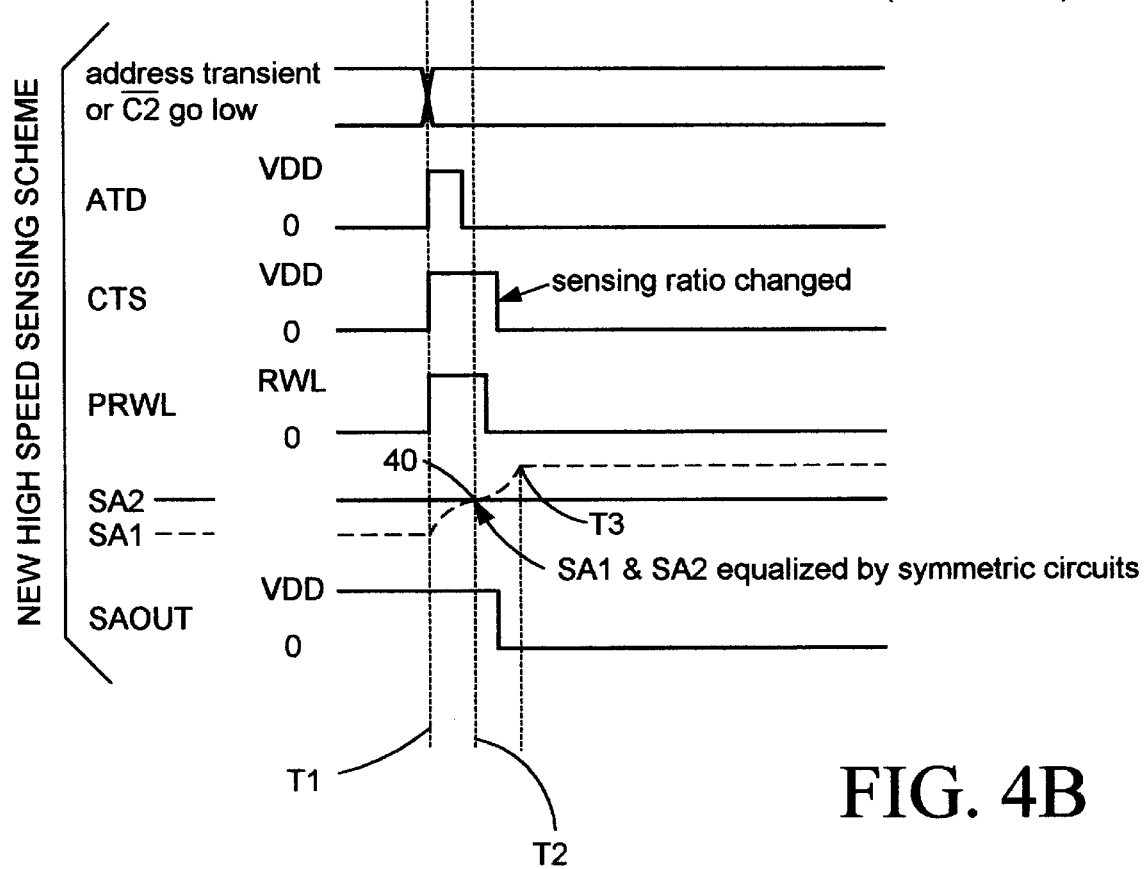
FIG. 4B is a timing diagram showing the timing sequence for sensing a low-to-high logic state transition with the sensing apparatus of the present invention shown in FIG. 5.

FIGS. 3B and 4B show timing diagrams illustrating how the sensing circuit of FIG. 5 minimizes memory cell read times in the case when the memory cell is transitioning from a HIGH to LOW logic state (FIG. 3B) and from a LOW to HIGH logic state (FIG. 4B). Referring to FIG. 3B, initially the voltage on comparator input SA1 (dashed line) is at a HIGH logic state and is greater than the reference voltage signal coupled to the comparator input SA2 (solid line). A transition of one of the address signals (A0, A1, ... An) or the CE signal causes the ATD detection pulse to be generated at time T1. When this occurs both the CTS and PRWL signals are driven HIGH turning on loading devices M6 and M7 and dummy cell XREF1. As a result, input SA1 drops from a voltage corresponding to a HIGH logic level to a voltage equivalent to $V_{SA2}$ (shown by indicator 30 in FIG. 3B). At time T2 the address is decoded. Once the address is decoded, signal PRWL is disabled (i.e., PRWL goes LOW) turning off dummy cell XREF1. Thereafter, signal CTS is disabled (i.e., CTS goes LOW) turning off loading devices M6 and M7.

It should be noted that in FIG. 3B the PRWL signal is disabled just before T2 when the real cell XCELL0 is selected and the $I_{XCELL0}$ begins to flow through the array circuit branch 1. However, since the CTS signal controls the resistive load of the array circuit branch 1 and not the array circuit branch current, the CTS signal does not need to be as precisely controlled. Instead, this signal can be disabled at a slightly. later time than the PRWL signal as shown in FIG. 3B. In particular, at time T2, the voltage $V_{SA1}$ will begin to transition LOW as long as the $I_{XCELL0}$ is greater than the $I_{REF0}$. The $V_{SA1}$ transitions even lower when the CTS signal is disabled.

With XREF1 disabled, the logic state of the cell can be sensed starting at point 30 (FIG. 3B). As a result, the cell is sensed earlier than the conventional sensing method since a portion of the transition of SA1 occurs prior to the time the current in the array branch is about to be sensed (i.e., between T1 and T2) and the other portion occurs after the cell current has been sensed (i.e., between T2 and T3). Similarly FIG. 4B shows that initially the voltage on comparator input SA1 is at a LOW logic state and the voltage on comparator input SA2 is at a voltage dependent on the loading devices 14 and the reference cell XREF0. At time T1, the ATD pulse is generated causing the CTS and PRWL signals to be applied such that the voltage on SA1 rises to an essentially equivalent voltage as SA2 (shown in FIG. 4B by indicator 40). When the address has been decoded at time T2, the PRWL signal is disabled and transitions LOW which disables the XREF1 cell. Thereafter, the loading devices M6 and M7 are disabled. As a result, comparator input SA1 transitions to a voltage indicative of the logic state stored in the memory cell (i.e., HIGH logic state) at time T3.

In comparing the two timing diagrams it can be seen that the memory cell is sensed sooner in FIGS. 3B and 4B than 3A and 4B, respectively. In addition, it should also be noted that the initial rise and fall time of the SA1 signal is faster in FIGS. 3B and 4B since the RC constant during the pre-decode interval is less than the RC constant during the post decode period (i.e., $R_{M0}C > R_{M0\|M6\|M7}C$).

In one embodiment, the threshold voltage of the dummy cell XREF1 can be selected to be equivalent to the threshold voltage of the reference cell XREF0 and the pre-decode bias signal PRWL which is coupled to the gate of the dummy cell XREF1 can be selected to be equivalent to RWL such that when both XREF0 and XREF1 are biased on, they both provide the same current in each of the reference and array circuit branches, respectively. Consequently, when the ATD detection pulse is generated and the voltage generator 19 is enabled, it outputs a voltage $V_{PRWL}=V_{RWL}$ such that $I_{REF0}=I_{REF1}$. In addition, when CTS is enabled, MOS loading devices M6 and M7 are enabled and biased such that the resistivity of the parallel combination of MOS loading devices 14 is essentially the same as the resistivity of the parallel combination of MOS loading devices 16 as indicated below:

$$R_{M2}\|R_{M3}\|R_{M4} = R_{M0}\|R_{M6}\|R_{M7} \qquad \text{Eq. 4}$$

Consequently, the sensing ratio during the pre-decode interval is equal to unity, (i.e., $R_{M2}\|R_{M3}\|R_{M4}/R_{M0}\|R_{M6}\|R_{M7} \approx 1$). Moreover, with $I_{REF0} \approx I_{REF1}$ and $R_{M2}\|R_{M3}\|R_{M4}=R_{M0}\|R_{M6}\|R_{M7}$, $V_{SA1}$ is driven to a voltage essentially equal to $V_{SA2}$ during the pre-decode interval as described above. Once the CTS signal has been disabled, the sensing ratio becomes $R_{M0}/R_{M2}\|R_{M3}\|R_{M4}$ which allows proper sensing of the memory cell. In this particular example, $R_{M2}$, $R_{M3}$, $R_{M4}$, and $R_{M0}$ are selected such that the post-decode interval sensing ratio is about 3:1.

It should be understood that although FIG. 5 shows a particular number of resistive elements in each of the sets of loading devices 14 and 16 this particular arrangement is not indicative of any particular number of devices required to practice the sensing apparatus of the present invention. Moreover, the number of devices in each of the first sub-set of loading devices including device M0 and the second sub-set of loading devices including loading devices M6 and M7 can also vary.

It should also be apparent that both reference cell XREF0 and the array branch dummy cell XREF1 can be replaced by any type of current source having current characteristics similar to that of the non-volatile memory cell sensed in its low threshold state. Moreover, the criteria of the design is to achieve IREF0×R (equivalent load resistance of array branch)≅IREF1×R (equivalent load resistance of array branch) during pre-decode interval similar to the voltage level reached in Equation 3.

Figure 6A:
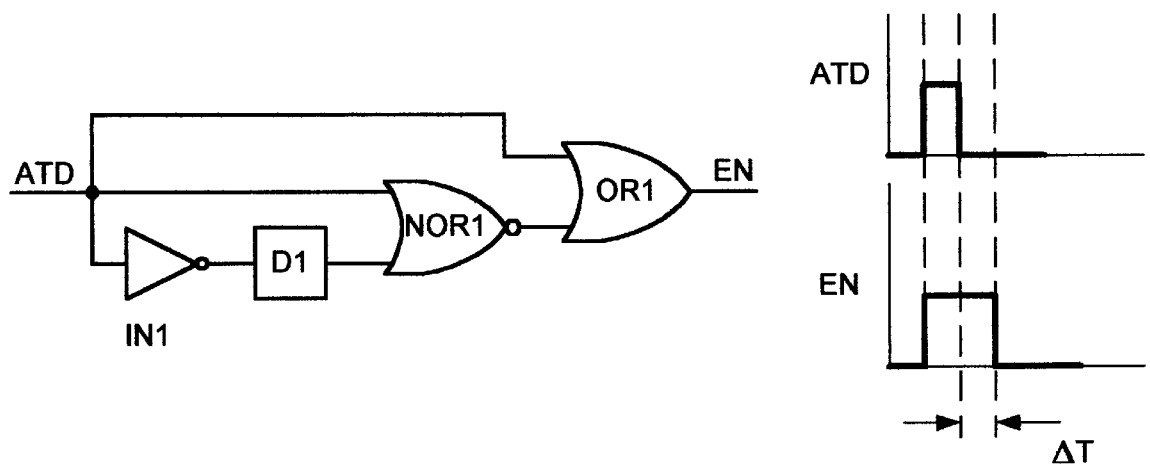
FIG. 6A shows an embodiment of control circuitry for enabling and disabling the array branch dummy cell for adjusting array branch pre-decode current characteristic.

FIG. 6A illustrates one embodiment of control circuitry for enabling and disabling the XREF1 cell with the PRWL signal. The control circuitry includes a first inverter IN1 having its input coupled to the ATD pulse and its output coupled to a delay device D1 having an associated delay time ΔT. The ΔT time interval is the pre-decode time interval or the pre-decode time interval plus the time it takes for the gate of the selected cell to reach a pre-determined voltage level. The output of the delay device is coupled to a first input of a NOR device NOR1 and the second input of NOR1 is coupled to the ATD pulse. The output of the NOR1 device is coupled to the input of an OR gate OR1 which has its second input also coupled to the ATD pulse. The OR1 gate generates an EN signal having a first state which enables the generation of the PRWL bias signal and a second logic state which disables the PRWL bias signal. The timing diagram shown in FIG. 6A shows that the EN signal remains in a HIGH enable state for a duration of ΔT after the ATD signal transitions LOW. CTS is designed to be disabled after a few gates of delay after PRWL is disabled.

Figure 6B:
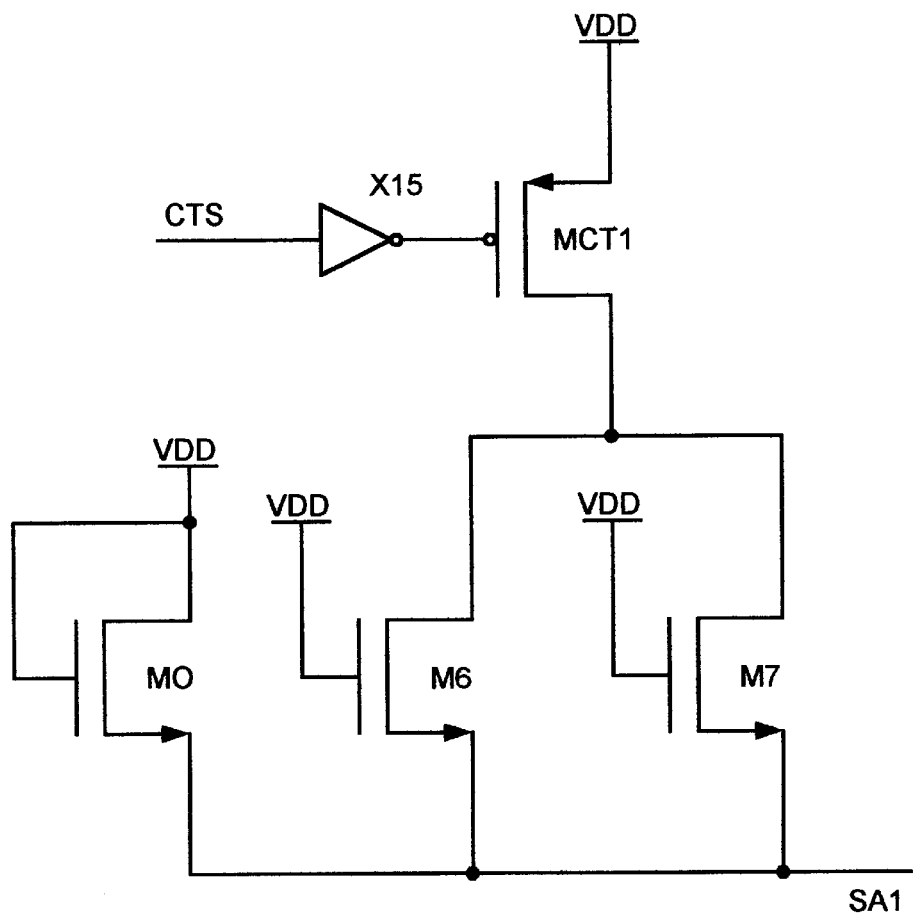
FIG. 6B shows an embodiment of control circuitry for enabling additional loading devices for adjusting array branch pre-decode loading characteristic.

FIG. 6B shows an embodiment of control circuitry for enabling and disabling loading device M6 and M7 which includes a p-type switching device MCT1 and an inverter XI5. The input of inverter XI5 is coupled to the CTS signal and the output of the inverter is coupled to the control gate of device MCT1. Device MCT1 is coupled between VDD and the drains of M6 and M7. The gates of M6 and M7 are each coupled to VDD. With CTS LOW (i.e., disable state), MCT1 is off and a current path does not exist through M6 and M7. With CTS HIGH (i.e., enable state), MCT1 is on and since the gates of M6 and M7 are coupled to VDD, these devices are also on.

Figure 7A:
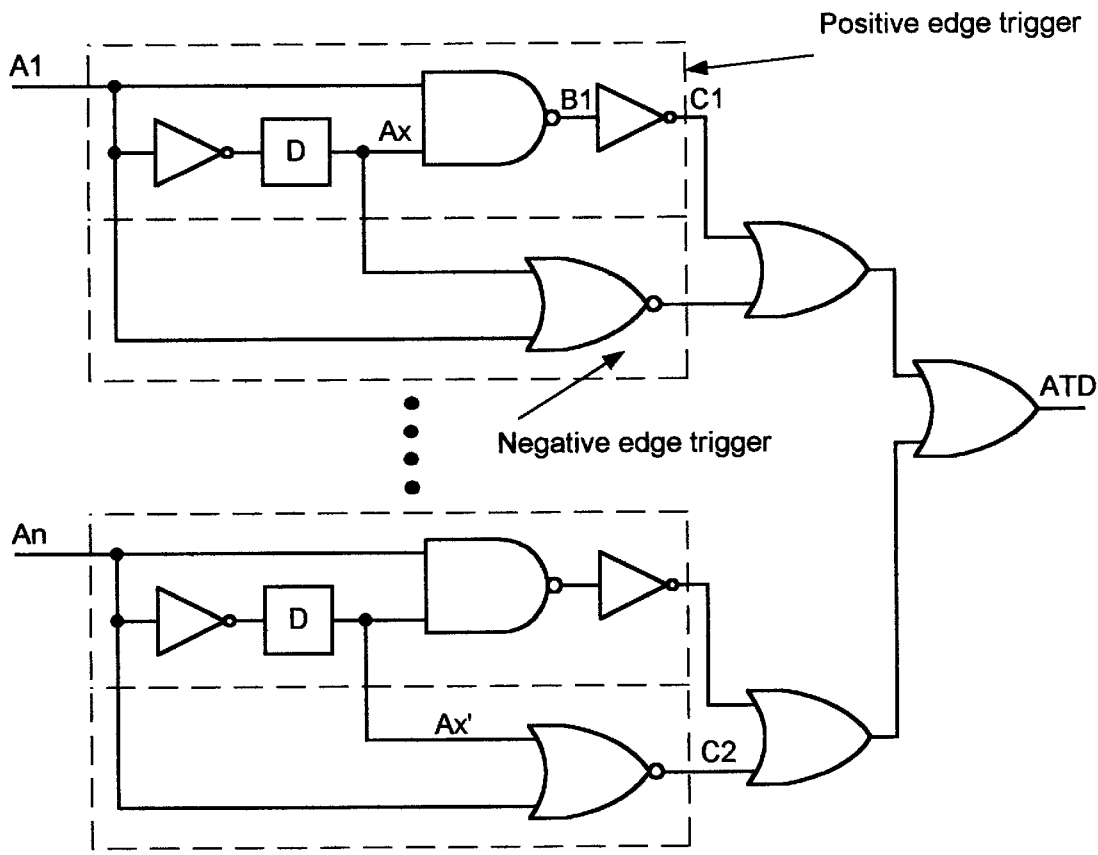
FIGS. 7A–8B show embodiments of ATD pulse generation circuitry and corresponding timing diagrams.
Figure 7B:
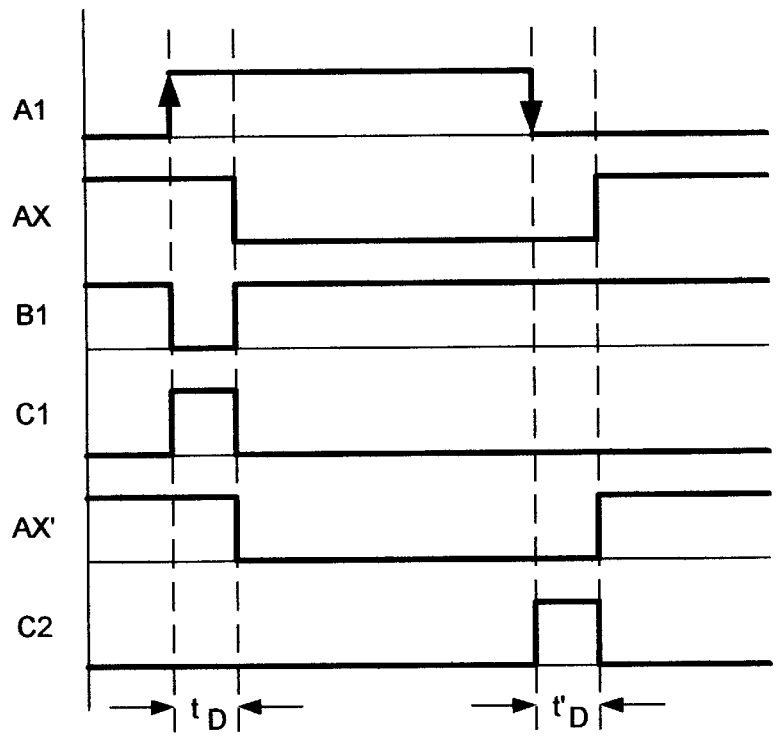
Figure 8A:
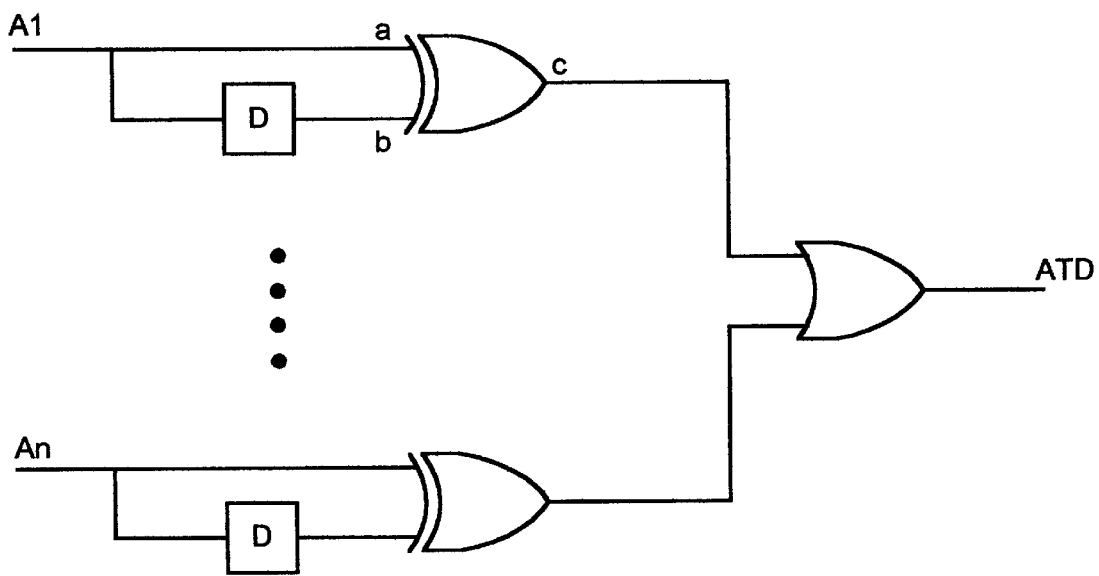
Figure 8B:
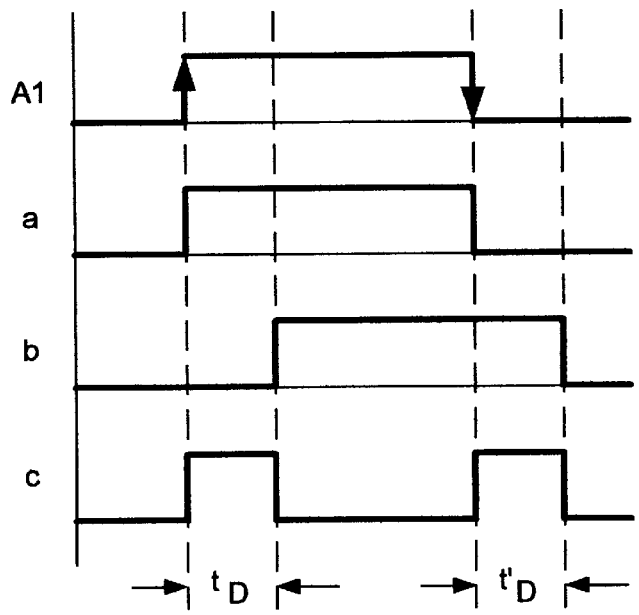

FIGS. 7A and 8A show two embodiments of address transient detector 18 and FIGS. 7B and 8B show corresponding timing diagrams. The ATD circuit shown in FIG. 7A is implemented with a plurality of individual address detector circuits each coupled to an address signal (or chip enable) signal and each having positive and negative edge trigger devices. The output of each of the positive and negative edge triggered devices are ORed together and the outputs of each OR gate corresponding to each address signal is then ORed together again to generate the ATD pulse signal. The delay element D can be implemented as a weak inverter which charges up transistor connected capacitors to provide an associated RC delay time. In operation, if any of the plurality of individual circuits detects a positive or negative address transition, the ATD pulse signal transitions HIGH and after a delay time $t_D'$ the ATD pulse signal transitions LOW again (FIG. 7B). It should be noted that $t_D$ and $t_D'$ are not necessarily equal. Alternatively, in another embodiment of the address transient detector 18 shown in FIG. 8A, an exclusive OR gate is used to detect input transitions of each address signal to generate the ATD pulse.

It should also be noted that the invention can also be adapted to a memory configuration in which more than one $V_{SA2}$ voltage level is established and compared to the memory cell threshold. For instance, in one embodiment, three different $V_{SA2}$ levels are established to distinguish four different logic states of a given cell. In this case, the present invention would establish an equivalent voltage $V_{SA1}$ corresponding to each of the different $V_{SA2}$ voltage level concurrently or separately during the pre-decode time period.

It should also be noted that the sensing circuit is applicable to volatile memory systems such as static RAM (SRAM) memory systems and dynamic RAM (DRAM) memory systems.

In the preceding description, numerous specific details are set forth, such as number of loading devices in order to provide a thorough understanding of the present invention. It will be apparent, however, to one skilled in the art that these specific details need not be employed to practice the present invention. In other instances, well known memory system structures and theory have not been described in order to avoid unnecessarily obscuring the present invention.

Moreover, although the components of the present invention have been described in conjunction with a certain embodiment, it is appreciated that the invention can be implemented in a variety of other ways. Consequently, it is to be understood that the particular embodiment shown and described by way of illustration is in no way intended to be considered limiting. Reference to the details of this embodiment is not intended to limit the scope of the claims which themselves recite only those features regarded as essential to the invention.

What is claimed is:

1. A sensing apparatus for sensing a logic state stored in a memory cell, said memory cell having an associated bit-line and an associated word-line, wherein when said memory cell is accessed by an address which selects said associated bit-line and said associated word-line, a voltage corresponding to said logic state is sensed by said sensing apparatus, said apparatus comprising:

a means for comparing voltages having a sensing input and a reference signal input;

a means for establishing a reference voltage on said reference signal input;

a means for detecting a signal transition which occurs prior to the selection of said associated bit-line and said associated word-line and generating a detection pulse;

a means for pre-charging said sensing input of said comparing means in response to said detection pulse to a voltage essentially equivalent to said reference voltage, said pre-charge means being disabled when said associated bit-line and said associated word-line have been selected;

a means for establishing said voltage corresponding to said logic state of said memory cell on said sensing input of said comparing means when said associated bit-line and associated word-line have been selected;

wherein said comparing means outputs a signal representing said logic state of said memory cell after said associated bit-line and associated word-line have been selected; wherein said pre-charging means includes a first circuit branch having a first set of loading devices coupled between a first working potential and said sensing input including a first sub-set of loading devices and a second sub-set of loading devices, wherein said second sub-set of loading devices are enabled once said detection pulse is generated and are disabled after said associated bit-line and associated word-line are selected; and said reference voltage means includes a second circuit branch having a second set of loading devices coupled between said first working potential and said reference signal input;

wherein once said detection pulse is generated and when said associated bit-line and associated word-line are selected, said first and second sets of loading devices are essentially electrically equivalent.

2. The sensing apparatus as described in claim 1 wherein said pre-charging means further includes a control means for enabling said second sub-set of loading devices in response to said detection pulse, said control means being disabled when said associated word-line has been selected.

3. The sensing apparatus as described in claim 2 wherein a ratio of said first sub-set of loading devices and said second set of loading devices ensures accurate sensing of said logic state by said sensing apparatus.

4. The sensing apparatus as described in claim 1 wherein said memory cell is a memory storage device in a static RAM.

5. The sensing apparatus as described in claim 1 wherein said memory cell is a memory storage device in a dynamic RAM.

6. The sensing apparatus as described in claim 1 wherein said memory cell is a floating gate device.

7. A sensing apparatus for sensing a logic state stored in a memory cell, said memory cell having an associated bit-line and an associated word-line, wherein when said memory cell is accessed by an address which selects said associated bit-line and said associated word-line, a voltage corresponding to said logic state is sensed by said sensing apparatus, said apparatus comprising:

a means for comparing voltages having a sensing input and a reference signal input;

a means for establishing a reference voltage on said reference signal input;

a means for detecting a signal transition which occurs prior to the selection of said associated bit-line and said associated word-line and generating a detection pulse;

a means for pre-charging said sensing input of said comparing means in response to said detection pulse to a voltage essentially equivalent to said reference voltage, said pre-charge means being disabled when said associated bit-line and said associated word-line have been selected;

a means for establishing said voltage corresponding to said logic state of said memory cell on said sensing input of said comparing means when said associated bit-line and associated word-line have been selected;

wherein said comparing means outputs a signal representing said logic state of said memory cell after said associated bit-line and associated word-line have been selected;

wherein said pre-charging means includes a first means for establishing a given current characteristic at said sensing input and a second means for establishing a given loading characteristic at said sensing input such that said sensing input voltage is essentially equal to said reference voltage; and further including means for enabling said first current establishing means including a first inverting device having its input coupled to said detection pulse and its output coupled to an input of a delay device, said delay device having its output coupled to a first input of a NOR gate, said NOR gate having its second input coupled to said detection pulse and having its output coupled to a first input of an OR gate, said second input of said OR gate being coupled to said detection pulse, said delay device having an associated time delay, said OR gate outputting a first control signal which enables said first current establishing means in response to said detection signal and which disables said current establishing means a time interval equivalent to said time delay after said detection pulse.

8. The sensing apparatus as described in claim 7 wherein said first current establishing means is disabled when said associated bit-line and associated word-line have been selected and said second load establishing means is disabled in the time interval occurring after said associated bit-line and associated word-line have been selected but prior to a time when said sensing input senses said voltage corresponding to said logic state in said memory cell.

9. A sensing apparatus for sensing a logic state stored in a memory cell, said memory cell having an associated bit-line and associated word-line, wherein when said memory cell is accessed by an address which selects said associated bit-line and associated word-line, a voltage corresponding to said logic state is sensed by said sensing apparatus, said apparatus comprising:

a means for comparing voltages having a sensing input and a reference signal input;

a means for establishing a reference voltage on said reference signal input;

a means for detecting a signal transition which occurs prior to the selection of said associated bit-line and associated word-line and generating a detection pulse;

a means for pre-charging said sensing input of said comparing means in response to said detection pulse to a voltage essentially equivalent to said reference voltage, said pre-charge means being disabled when said associated bit-line and said associated word-line have been selected;

a means for establishing said voltage corresponding to said logic state of said memory on said sensing input of said comparing means when said associated bit-line and associated word-line have been selected;

wherein said comparing means outputs a signal representing said logic state of said memory cell after said associated bit-line and associated word-line have been selected;

wherein said pre-charging means includes a first means for establishing a given current characteristic at said sensing input and a second means for establishing a given loading characteristic at said sensing input such that said sensing input voltage is essentially equal to said reference voltage; and wherein said second load establishing means includes a least one loading device having its gate coupled to a first working potential and being coupled between a first node and said sensing input for establishing said given loading characteristic on said sensing input and wherein said apparatus further includes a means for enabling said second load establishing means including a means for generating a control signal in response to said detection pulse, an inverting device having its input coupled to said control signal and having its output coupled to a gate of a switching device, said switching device being coupled between said first working potential and said first node, said control signal in a first state enabling said switching device thereby providing a current path through said at least one loading device and in a second state disabling said switching device thereby disallowing a current path through said at least one loading device.

10. A method of sensing a logic state in a memory cell, said memory cell having an associated bit-line and associated word-line, wherein when said memory cell is accessed by an address which selects said associated bit-line and associated word-line, a voltage corresponding to said logic state is sensed by a comparator, said method comprising:

establishing a reference voltage on a reference signal input of said comparator;

detecting a signal transition which occurs prior to the selection of said associated bit-line and associated word-line;

pre-charging a sensing input of said comparator to a voltage near or equal to said reference voltage in response to said signal transition and when said associated bit-line and associated word-line are selected by switching loading devices on the sensing input;

establishing said voltage corresponding to said logic state of said memory cell on said sensing input once said associated bit-line and associated word-line have been selected;

comparing said voltage on said sensing input to said reference voltage on said reference signal input and, depending on the comparison, outputting a signal representing said logic state of said memory cell after said associated bit-line and associated word-line have been selected.

11. The method as described in claim 10 wherein said step of pre-charging comprises the step of establishing a current characteristic and a loading characteristic at said sensing input.

12. The method as described in claim 10 wherein said step of pre-charging comprises the step of establishing a current characteristic and a loading characteristic at said sensing input equivalent to a current characteristic and a loading characteristic at said reference signal input.

13. The method as described in claim 11 wherein said step of establishing said loading characteristic comprises the step of enabling additional loading devices when said word-line is selected.

14. The method as described in claim 10 wherein said step of establishing a reference voltage comprises the step of biasing a first current source device to establish a first current and said step of pre-charging said sensing input comprises the steps of biasing a second current source device to establish a second current which is equivalent to said first current during a pre-decode time interval defined to be between said detection pulse being generated and said associated bit-line and associated word-line being selected.

15. The method as described in claim 14 wherein at least one of said first current source device and said second current source device is a floating gate device.

16. The method as described in claim 10 wherein said memory cell is a memory storage device in a static RAM.

17. The method as described in claim 10 wherein said memory cell is a memory storage device in a dynamic RAM.

18. The method as described in claim 10 wherein said memory cell is a floating gate device.

19. A sensing apparatus for sensing a logic state in a memory cell, said memory cell having an associated bit-line and associated word-line, wherein when said memory cell is accessed by an address which selects said associated bit-line and associated word-line, a voltage corresponding to said logic state is sensed, said apparatus comprising:

a comparator having a sensing input and a reference signal input;

a first circuit branch for establishing said voltage corresponding to said logic state of said memory cell on said sensing input when said associated bit-line and associated word-line have been selected;

a second circuit branch for establishing a reference voltage on said reference signal input;

a transient detection circuit for detecting a signal transition which occurs prior to the selection of said associated bit-line and associated word-line and for generating a detection pulse; and pre-charge circuitry including loading devices which pre-charges said sensing input to a pre-charge voltage equal or near to said reference voltage by switching the loading devices on said sensing input between a read state and a pre-charge state in response to said detection pulse, said pre-charge circuitry being disabled when said associated bit line and associated word line have been selected.

20. The sensing apparatus as described in claim 19 wherein said pre-charge circuitry further includes a voltage generator responsive to said detection pulse, said voltage generator providing a first bias voltage, said first circuit branch includes a first current source device with a predetermined first threshold voltage wherein once said detection pulse is generated and prior to said associated bit-line and associated word-line being selected, said first current source device is biased by said first bias voltage to establish a first current in said first branch which is equivalent to a second current established in said second circuit branch.

21. The sensing apparatus as described in claim 20 wherein a least one of said first current source device and said second current source device is a floating gate device.

22. The sensing apparatus as described in claim 19 wherein said pre-charge circuitry further includes a sensing ratio controller, said first circuit branch includes a first set of loading devices having first sub-set of loading devices and a second sub-set of selectable loading devices, and said second circuit branch includes a second set of loading devices, wherein said sensing ratio controller provides an enable signal responsive to said detection pulse which enables said second sub-set of selectable loading devices and when said associated word-line has been selected said second sub-set of loading devices are disabled.

23. The sensing apparatus as described in claim 22 wherein a first ratio associated with said second set of loading devices and said first set of loading devices including only said first sub-set of loading devices ensures accurate sensing of said logic state by said sensing apparatus and a second ratio associated with said second set of loading devices and said first set of loading devices including both said first sub-set of loading devices and said second sub-set of loading devices is approximately unity.

24. A sensing apparatus for sensing a logic state in a memory cell, said memory cell having an associated bit-line and associated word-line, wherein when said memory cell is accessed by an address which selects said associated bit-line and associated word-line, a voltage corresponding to said logic state is sensed, said apparatus comprising:

a comparator having a sensing input and a reference signal input;

a sensing circuit portion including a first circuit branch for establishing a reference voltage on a reference signal input and a second circuit branch for establishing said voltage corresponding to said logic state of said memory cell on said sensing input of said comparator when said associated bit-line and associated word-line have been selected, said comparator comparing said voltage on said sensing input to said reference voltage on said reference signal input and outputting a signal representing said logic state of said memory cell after said associated bit-line and associated word-line have been selected, said first and second branches having an associated sensing ratio dependent on current and loading characteristics of said each of said first and second branches; and a second circuit portion having circuitry coupled to said sensing input for establishing a sensing ratio approximately equivalent to unity, said circuitry being enabled in a time interval starting from a time when an access to said memory cell is initiated until a time in which said associated bit-line and associated word-line have been selected.

25. The sensing apparatus as described in claim 24 wherein said second circuit portion including pre-charge circuitry for pre-charging said sensing input to a voltage essentially equal to said reference voltage in said time interval.

26. The sensing apparatus as described in claim 25 wherein said pre-charge circuitry includes at least one load device and at least one current device which are enabled during said time interval.

27. The sensing apparatus as described in claim 26 further including a detection circuit for detecting one of an input address transition and a chip enable transition and outputting a detection pulse, said detection pulse enabling said pre-charge circuitry.

28. The sensing apparatus as described in claim 27 further including a first control means for enabling said at least one load device in response to said detection pulse, said control means being disabled when said associated word-line has been selected.

29. The sensing apparatus as described in claim 27 further including a voltage generator for generating a voltage for biasing said at least one current source device in response to said detection pulse.

30. The sensing apparatus as described in claim 24 wherein said memory cell is a memory storage device in a static RAM.

31. The sensing apparatus as described in claim 24 wherein said memory cell is a memory storage device in a dynamic RAM.

32. The sensing apparatus as described in claim 24 wherein said memory cell is a floating gate device.

* * * * *